(12) United States Patent
Tsumagari et al.

(10) Patent No.: US 10,653,007 B2
(45) Date of Patent: May 12, 2020

(54) FLEXIBLE PRINTED CIRCUIT BOARD

(71) Applicants: SUMITOMO ELECTRIC PRINTED CIRCUITS, INC., Koka-shi, Shiga (JP); AutoNetworks Technologies, Ltd., Yokkaichi, Mie (JP); Sumitomo Electric Industries, Ltd., Osaka-shi, Osaka (JP); Sumitomo Wiring Systems, Ltd., Yokkaichi, Mie (JP)

(72) Inventors: Takayuki Tsumagari, Koka (JP); Yoshifumi Uchita, Koka (JP); Shinichi Takase, Mie (JP); Hirohisa Saito, Osaka (JP)

(73) Assignees: SUMITOMO ELECTRIC PRINTED CIRCUITS, INC., Koka-shi, Shiga (JP); AutoNetworks Technologies, Ltd., Yokkaichi, Mie (JP); Sumitomo Electric Industries, Ltd., Osaka-shi, Osaka (JP); Sumitomo Wiring Systems, Ltd., Yokkaichi, Mie (JP)

( * ) Notice: Subject to any disclaimer, the term of this patent is extended or adjusted under 35 U.S.C. 154(b) by 0 days.

(21) Appl. No.: 15/738,301

(22) PCT Filed: Jun. 22, 2016

(86) PCT No.: PCT/JP2016/068488
§ 371 (c)(1),
(2) Date: Dec. 20, 2017

(87) PCT Pub. No.: WO2016/208613
PCT Pub. Date: Dec. 29, 2016

(65) Prior Publication Data
US 2018/0192511 A1  Jul. 5, 2018

(30) Foreign Application Priority Data

Jun. 24, 2015 (JP) ................................. 2015-127097
Oct. 22, 2015 (JP) ................................. 2015-208436

(51) Int. Cl.
*H05K 1/02* (2006.01)
*H05K 1/03* (2006.01)
(Continued)

(52) U.S. Cl.
CPC ....... *H05K 1/0293* (2013.01); *H01H 85/0241* (2013.01); *H01H 85/046* (2013.01);
(Continued)

(58) Field of Classification Search
CPC ...... H05K 1/0293; H05K 1/028; H05K 3/027; H05K 2201/10181; H05K 3/005;
(Continued)

(56) References Cited

U.S. PATENT DOCUMENTS 4,296,398 A * 10/1981 McGalliard .......... H01H 85/046
337/232
5,196,819 A * 3/1993 Roberts ................ H01H 85/046
29/623

(Continued)

FOREIGN PATENT DOCUMENTS

EP  1045625 A1  10/2000
EP  2429267 A1  3/2012
(Continued)

OTHER PUBLICATIONS

Japanese Office Action dated May 14, 2019 that issued in JP Patent Application No. 2015-208436, along with its English-language translation attached.

(Continued)

*Primary Examiner* — Ishwarbhai B Patel
(74) *Attorney, Agent, or Firm* — Faegre Drinker Biddle & Reath LLP

(57) ABSTRACT

A flexible printed circuit board according to an aspect of the present invention includes a base film having insulating properties and a conductive pattern laminated to one surface
(Continued)

side of the base film. The conductive pattern forms part of a circuit and includes at least one fuse portion having a cross section smaller than the other part. The flexible printed circuit board includes at least one opening passing through front and rear surfaces on at least one of the right and left sides of the fuse portion in a two-dimensional view.

8 Claims, 1 Drawing Sheet

(51) Int. Cl.
    *H01H 85/046* (2006.01)
    *H01H 85/02* (2006.01)
    *H01H 69/02* (2006.01)
    *H05K 3/06* (2006.01)
    *H05K 3/00* (2006.01)
    *H01H 85/10* (2006.01)
    *H05K 3/02* (2006.01)

(52) U.S. Cl.
    CPC .......... *H05K 1/028* (2013.01); *H05K 1/0257* (2013.01); *H01H 69/022* (2013.01); *H01H 85/10* (2013.01); *H01H 2085/0275* (2013.01); *H05K 1/0256* (2013.01); *H05K 1/0393* (2013.01); *H05K 3/005* (2013.01); *H05K 3/0026* (2013.01); *H05K 3/027* (2013.01); *H05K 3/064* (2013.01); *H05K 2201/09063* (2013.01); *H05K 2201/09727* (2013.01); *H05K 2201/10181* (2013.01); *H05K 2203/068* (2013.01); *H05K 2203/107* (2013.01)

(58) Field of Classification Search
    CPC .......... H05K 3/0026; H05K 2203/107; H05K 2203/068; H05K 3/064; H01H 69/022; H01H 85/0241; H01H 85/046; H01H 2085/0275; H01H 85/10
    See application file for complete search history.

(56) References Cited

U.S. PATENT DOCUMENTS

| | | | | |
|---|---|---|---|---|
| 5,923,239 A | * | 7/1999 | Krueger | H01H 69/022 337/152 |
| 2008/0265389 A1 | * | 10/2008 | Hsu | H01L 23/49838 257/686 |
| 2012/0200974 A1 | | 8/2012 | Mikami et al. | |

FOREIGN PATENT DOCUMENTS

| | | |
|---|---|---|
| JP | S38-26053 Y | 12/1963 |
| JP | S53-88193 | 8/1978 |
| JP | S53-109058 U | 9/1978 |
| JP | S55-108776 U | 7/1980 |
| JP | S55-108777 U | 7/1980 |
| JP | S55-152078 U | 11/1980 |
| JP | S58-134853 U | 9/1983 |
| JP | S63-3174 U | 1/1988 |
| JP | 2003-173730 A | 6/2003 |
| JP | 2007-317990 A | 12/2007 |
| JP | 2012-164758 A | 8/2012 |
| WO | WO 01/59799 A1 | 8/2001 |

OTHER PUBLICATIONS

JP Office Action dated Dec. 10, 2019 from corresponding Japanese patent application No. 2019-146277 (with attached English-language translation).

* cited by examiner

FLEXIBLE PRINTED CIRCUIT BOARD

TECHNICAL FIELD

The present invention relates to a flexible printed circuit board.

BACKGROUND ART

Flexible printed circuit boards have widely been used to configure electric circuits for electronic devices and others. In order to prevent damage to electronic components due to overcurrent in electronic devices and others, it may be desired to provide a fuse which blows to interrupt current when overcurrent flows. For this purpose, a fuse may be mounted on a flexible printed circuit board.

Mounting a fuse on a flexible printed circuit board increases the number of components and mount steps and thereby increases the costs for the flexible printed circuit board. It has then been proposed to partially reduce the cross section of the circuit formed with a conductive pattern in the flexible printed circuit board and provide the function as a fuse to be blown with overcurrent (see Japanese Patent Laying-Open No. 2007-317990).

CITATION LIST

Patent Document

PTD 1: Japanese Patent Laying-Open No. 2007-317990

SUMMARY OF THE INVENTION

A flexible printed circuit board according to an aspect of the present invention includes a base film having insulating properties and a conductive pattern laminated to one surface side of the base film. The conductive pattern forms part of a circuit and includes at least one fuse portion having a cross section smaller than the other part. The flexible printed circuit board includes at least one opening portion passing through front and rear surfaces on at least one of right and left sides of the fuse portion in a two-dimensional view.

DESCRIPTION OF EMBODIMENTS

Figure 1:
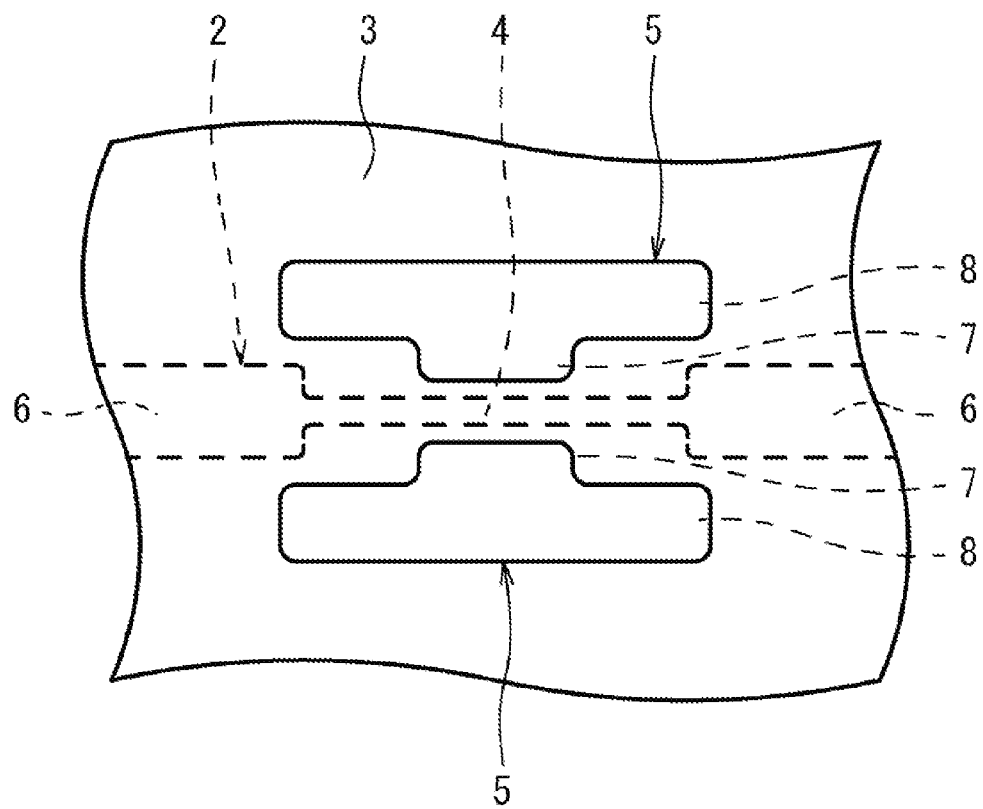
FIG. 1 is a plan view schematically showing a flexible printed circuit board according to an embodiment of the present invention.

Problems to be Solved by the Invention

In the configuration of the flexible printed circuit board described in the publication above, when the fuse portion formed by reducing the cross section blows, the fuse portion of the base film of the flexible printed circuit board is heated and carbonized, and the resultant carbide may cause a short circuit between both ends of the blown fuse portion to disable interruption of current or may cause a short circuit between the wiring of the fuse portion and adjacent another wiring to produce abnormal current.

Moreover, in the configuration of the flexible printed circuit board described in the publication above, heat of the fuse portion escapes to the base film to make it difficult for the fuse portion to blow, so that interruption of overcurrent may be delayed.

The present invention is made based on the situation described above and an object of the present invention is to provide a flexible printed circuit board capable of interrupting overcurrent relatively reliably.

Effects of the Invention

A flexible printed circuit board according to an aspect of the present invention can interrupt overcurrent relatively reliably.

Description of Embodiment of the Present Invention

A flexible printed circuit board according to an aspect of the present invention includes a base film having insulating properties and a conductive pattern laminated to one surface side of the base film. The conductive pattern forms part of a circuit and includes at least one fuse portion having a cross section smaller than the other part. The flexible printed circuit board includes at least one opening portion passing through front and rear surfaces on at least one of right and left sides of the fuse portion in a two-dimensional view.

The flexible printed circuit board includes at least one opening portion passing through front and rear surfaces on at least one of right and left sides of the fuse portion in a two-dimensional view, thereby reducing the heat capacity in a vicinity region to which heat may conduct from the fuse portion. This can suppress heat dissipation from the fuse portion and induce the fuse portion to blow in a region close to the opening portion and, in addition, reduce a delay in current interruption. Therefore, overcurrent can be interrupted relatively reliably. In this manner, since the blowing of the fuse portion is accelerated, the time during which the fuse portion-laminated region in the base film is heated is reduced, and carbonization of the base film is suppressed. Accordingly, a short circuit between both ends of the blown fuse portion due to the carbide and a short circuit between one end of the fuse portion and another wiring in the circuit are prevented, thereby interrupting overcurrent relatively reliably. The "fuse portion" means a portion in which the cross section is 10% or more smaller than the circuit in front and back in its longitudinal direction (the direction current flows). The "right and left of the fuse portion" means a direction orthogonal to the longitudinal direction of the fuse portion and is not intended to limit the positional relation in the use state of the flexible printed circuit board.

The flexible printed circuit board may include a pair of the opening portions on both the right and left sides of the fuse portion in a two-dimensional view. In this manner, the flexible printed circuit board includes a pair of the opening portions on both the right and left sides of the fuse portion in a two-dimensional view, so that the effect of inducing the fuse portion to blow and the effect of suppressing generation of carbide are more significant, thereby interrupting overcurrent more reliably.

The opening portion may have a protruding portion close to a center region of a side edge of the fuse portion in a two-dimensional view. In this manner, the opening portion has a protruding portion close to a center region of a side edge of the fuse portion in a two-dimensional view, so that the heat capacity in the vicinity of the center region of the fuse portion can be reduced, and fast blowing of the fuse portion can be further ensured. In addition, the blowing position of the fuse portion can be induced to the center region. The "center region" means a region excluding a range of 30% of the entire length of the fuse portion from each of both ends in the length direction of the fuse portion.

The protruding portion may have an end edge parallel to the side edge of the fuse portion. In this manner, the protruding portion has an end edge parallel to the side edge of the fuse portion, so that the heat capacity can be reduced continuously in a certain range in the vicinity of the center region of the fuse portion, thereby further accelerating blowing of the fuse portion. As used herein "parallel" means that the angle therebetween is 5° or less, preferably 3° or less.

There may be a gap between the side edge of the fuse portion and the protruding portion of the opening portion in a two-dimensional view. In this manner, there is a gap between the side edge of the fuse portion and the protruding portion of the opening portion in a two-dimensional view to absorb a displacement between the fuse portion and the opening portion during manufacturing, thereby preventing reduction of the width of the fuse portion during formation of the opening portion and thus undesired reduction of a current value for blowing.

The fuse portion may have a line width smaller than a wiring portion in front and back of the fuse portion. The shortest distance in a width direction from a longitudinally central line of the circuit including the fuse portion to the protruding portion of the opening portion may be smaller than the average distance in the width direction from the longitudinally central line to a side edge on the opening portion side of the wiring portion in front and back of the fuse portion, in a two-dimensional view. In this manner, the shortest distance in a width direction from a longitudinally central line of the circuit including the fuse portion to the protruding portion of the opening portion is smaller than the average distance in the width direction to the side edge of the wiring portion in front and back of the fuse portion in a two-dimensional view, so that the heat capacity in the vicinity of the center region of the fuse portion is reduced, thereby further accelerating blowing of the fuse portion. In addition, generation of carbide during blowing of the fuse portion is suppressed more reliably, thereby further ensuring interruption of overcurrent.

The opening portion may be disposed so as to cover the side edge of the fuse portion. In this manner, the opening portion is disposed so as to cover the side edge of the fuse portion, that is, such that the opening extends toward both sides in the longitudinal direction beyond the fuse portion, as viewed from the direction vertical to the longitudinal direction of the fuse portion, so that the heat capacity in the vicinity region is reduced over the entire length of the fuse portion, thereby further prompting the fuse portion to blow fast. In addition, generation of carbide can be prevented more reliably.

The flexible printed circuit board may further include an insulting layer to cover one surface side of a laminate including the base film and the conductive pattern. In this manner, the flexible printed circuit board further includes an insulting layer to cover one surface side of a laminate including the base film and the conductive pattern, so that exposure of the fuse portion can be suppressed to prevent a short circuit due to contact with, for example, another member or water.

Details of Embodiment of the Present Invention

An embodiment of a flexible printed circuit board according to the present invention will be described in detail below with reference to the drawings.

Flexible Printed Circuit Board

Figure 2:
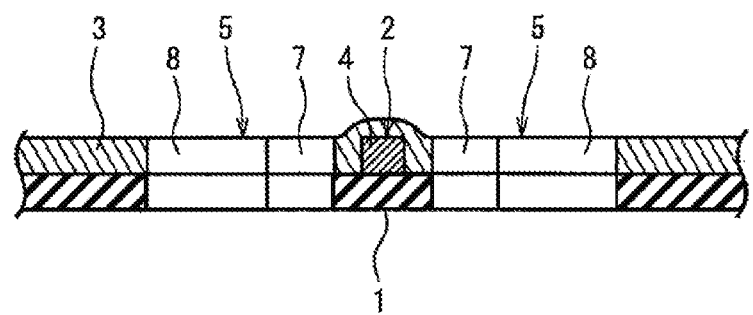
FIG. 2 is a schematic cross-sectional view of the flexible printed circuit board in FIG. 1.

A flexible printed circuit board of an embodiment of the present invention shown in FIGS. 1 and 2 includes a base film 1 having insulating properties and a conductive pattern 2 laminated to one surface side of this base film 1. The flexible printed circuit board also includes an insulting layer 3 laminated to cover one surface side of base film 1 and conductive pattern 2.

In the flexible printed circuit board, conductive pattern 2 forms part of a circuit and includes one fuse portion 4 having a cross section smaller than the other part. This fuse portion 4 is a portion formed to be blown with Joule heat when overcurrent flows through this circuit. More specifically, fuse portion 4 is a portion having a cross section reduced so as to be blown at least with current that flows when a power supply for use in the circuit of the flexible printed circuit board is directly connected to both ends thereof.

The flexible printed circuit board also includes a pair of opening portions 5 passing through front and rear surfaces on both the right and left sides of fuse portion 4 in a two-dimensional view. That is, opening portion 5 is a region in which base film 1, conductive pattern 2, or insulting layer 3 is not present in a two-dimensional view.

<Base Film>

Base film 1 is a structural member that supports conductive pattern 2 and ensures the strength of the flexible printed circuit board.

Examples of the main component of this base film 1 include flexible materials such as polyimide, liquid polymers including liquid crystal polyester, polyethylene terephthalate, polyethylene naphthalate, polyphenylene ether, and fluorocarbon polymers. Among those, polyimide excellent in heat resistance is preferable.

The thickness of base film 1 is not limited. For example, the lower limit of the average thickness of base film 1 is preferably 5 µm, more preferably 12 µm. When the average thickness of base film 1 is less than the lower limit above, the strength of base film 1 may be insufficient.

<Conductive Pattern>

Conductive pattern 2 is formed by at least partially patterning a layered conductor so as to form a circuit. This conductive pattern 2 includes a wiring portion 6 serving as an electric path and a fuse portion 4 formed to have a cross section smaller than the other part by reducing the width of part of this wiring portion 6. Conductive pattern 2 may also include, for example, a land for mounting an electronic component and a terminal portion for connecting wiring, though not shown.

The material of conductive pattern 2 may be any material that has conductivity and can be blown with Joule heat caused by passage of electric current. Examples of the material include metals such as copper, aluminum, and nickel. Copper, which is inexpensive and has high conductivity, is typically used. Conductive pattern 2 may be plated on its surface.

The lower limit of the average thickness of conductive pattern 2 is preferably 2 µm, more preferably 5 µm. On the other hand, the upper limit of the average thickness of conductive pattern 2 is preferably 500 µm, more preferably 100 µm. When the average thickness of conductive pattern 2 is less than the lower limit above, the conductivity may be insufficient. On the other hand, when the average thickness of conductive pattern 2 exceeds the upper limit above, the flexibility of the flexible printed circuit board may be insufficient or forming fuse portion 4 (partially reducing the cross section to be blown) may not be easy.

It is preferable that wiring portion 6 of conductive pattern 2 is formed into a strip shape having an approximately constant width. As used herein "approximately constant" means that a deviation as small as an error that may occur in manufacturing is permitted and preferably means that the difference from the average width is less than 10%.

The lower limit of the average width of this wiring portion 6 is preferably 0.1 mm, more preferably 0.2 mm. On the other hand, the upper limit of the average width of wiring portion 6 is preferably 1 mm, more preferably 0.8 mm. When the average width of wiring portion 6 is less than the lower limit above, the conductivity may be insufficient. Conversely, when the average width of wiring portion 6 exceeds the upper limit above, the flexible printed circuit board may be unnecessarily large.

<Insulting Layer>

Insulting layer 3 covers one surface side of a laminate including base film 1 and conductive pattern 2. This insulting layer 3 mainly prevents conductive pattern 2 from coming into contact with another member to be damaged or short-circuited.

For example, solder resist, coverlay, or the like may be used as insulating layer 3.

For example, a two-layer film having an insulating film and an adhesive layer may be used as the coverlay that forms insulating layer 3. When a two-layer coverlay is used as insulting layer 3, the material of the insulating film may be, but not limited to, the one similar to the resin film that forms base film 1.

The lower limit of the average thickness of the insulating film of the coverlay that forms insulating layer 3 is preferably 5 μm, more preferably 10 μm. On the other hand, the upper limit of the average thickness of the insulating film of the coverlay that forms insulating layer 3 is preferably 60 μm, more preferably 40 μm. When the average thickness of the insulating film of the coverlay that forms insulating layer 3 is less than the lower limit above, the insulating properties of insulting layer 3 may be insufficient. On the other hand, when the average thickness of the insulating film of the coverlay that forms insulating layer 3 exceeds the upper limit above, the flexibility of the flexible printed circuit board may be insufficient.

When a two-layer coverlay is used as insulting layer 3, the adhesive that forms the adhesive layer is preferably, but not limited to, the one excellent in flexibility and heat resistance. Examples of such an adhesive include a variety of resin-based adhesives such as nylon resin-based, epoxy resin-based, butyral resin-based, and acrylic resin-based adhesives. The average thickness of the adhesive layer of the coverlay that forms insulating layer 3 is preferably, but not limited to, 10 μm or more to 50 μm or less. When the average thickness of the adhesive layer of the coverlay that forms insulting layer 3 is less than the lower limit above, the adhesiveness may be insufficient. On the other hand, when the average thickness of the adhesive layer of the coverlay that forms insulting layer 3 exceeds the upper limit above, the flexibility of the flexible printed circuit board may be insufficient.

Examples of the solder resist that forms insulating layer 3 include photosensitive solder resist, thermosetting solder resist, and dry film solder resist.

Examples of the main component of the solder resist that forms insulting layer 3 include epoxy resins, polyimides, and silicone resins. Among those, epoxy resins, in particular, epoxy acrylate resins are preferably used.

The lower limit of the average thickness of the solder resist that forms insulating layer 3 on conductive pattern 2 is preferably, but not limited to, 5 μm, more preferably 10 μm. On the other hand, the upper limit of the average thickness of the solder resist that forms insulting layer 3 on conductive pattern 2 is preferably, but not limited to, 50 μm, more preferably 30 μm. When the average thickness of the solder resist that forms insulting layer 3 on conductive pattern 2 is less than the lower limit above, the insulating properties may be insufficient. Conversely, when the average thickness of the solder resist that forms insulting layer 3 on conductive pattern 2 exceeds the upper limit above, the flexibility of the flexible printed circuit board may be insufficient.

<Fuse Portion>

Fuse portion 4 is formed by reducing the width of part of wiring portion 6 to have a cross section smaller than the other part of wiring portion 6 whereby fuse portion 4 has a high electric resistance per unit length and is heated by Joule heat to blow when overcurrent flows. That is, fuse portion 4 is formed to have a line width smaller than wiring portion 6 in front and back.

The cross section of fuse portion 4 is designed such that fuse portion 4 is blown at least with current flowing when a power supply of the flexible printed circuit board is directly connected to both ends of fuse portion 4. Preferably, the cross section of fuse portion 4 is determined such that fuse portion 4 is blown with fusing current having a value smaller than current flowing when the above-noted power supply is directly connected. More specifically, the cross section of fuse portion 4 is selected as appropriate by setting the fusing current considering, for example, dielectric strength of an element mounted on the circuit, and considering the physical properties of the material of conductive pattern 2 so that fuse portion 4 is blown with the set fusing current, and the physical properties, shapes, etc. of the materials of base film 1 and insulating layer 3 that affect the amount of heat dissipation from fuse portion 4.

When conductive pattern 2 is formed of copper, the lower limit of the minimum width of fuse portion 4 is preferably 5 μm, more preferably 10 μm. On the other hand, the upper limit of the minimum width of fuse portion 4 is preferably 300 μm, more preferably 200 μm. When the minimum width of fuse portion 4 is less than the lower limit above, variation of the current value at which fuse portion 4 blows may be increased with a manufacturing error in width of fuse portion 4. Conversely, when the minimum width of fuse portion 4 exceeds the upper limit above, variation of the current value at which fuse portion 4 blows may be increased with a manufacturing error in thickness of fuse portion 4.

It is preferable that fuse portion 4 has a smallest cross section at the center portion in the length direction. It is also preferable that fuse portion 4 is shaped like a strip such that a portion with the smallest width (cross section) extends in the length direction. This can suppress that Joule heat produced at the center portion in the length direction of fuse portion 4 conducts in the front-back direction and escapes to wiring portion 6 on both sides, and can promote fast blowing of fuse portion 4 with overcurrent.

The lower limit of the length of fuse portion 4 (the length of the region having a cross section reduced by 10% or more compared with wiring portion 6 on both sides) is preferably 0.5 mm, more preferably 1 mm. On the other hand, the upper limit of the length of fuse portion 4 is preferably 20 mm, more preferably 15 mm. When the length of fuse portion 4 is less than the lower limit above, an escape of heat to the front and back in the length direction may not be suppressed sufficiently. Conversely, when the length of fuse portion 4 exceeds the upper limit above, the flexible printed circuit board may be unnecessarily large.

The upper limit of the ratio of the minimum value of the cross section of fuse portion 4 to the average cross section of wiring portion 6 in the vicinity of both ends of fuse portion 4 (the range in which the resistance value from each end portion is within 30% of fuse portion 4) is preferably 50%, more preferably 30%, further preferably 20%. On the other hand, the lower limit of the ratio of the cross section is preferably 2%, more preferably 5%, further preferably 8%. When the ratio of the cross section exceeds the upper limit above, fuse portion 4 may not blow fast even when overcurrent flows. Conversely, when the ratio of the cross section is less than the lower limit above, a manufacturing error of fusing current may be increased.

The lower limit of the length of the portion with approximately the smallest cross section of fuse portion 4 (the portion where the difference from the smallest value of the cross section is within 5%) is preferably 0.3 mm, more preferably 0.8 mm. On the other hand, the upper limit of the length of the portion with approximately the smallest cross section of fuse portion 4 is preferably 50 mm, more preferably 30 mm. When the length of the portion with approximately the smallest cross section of fuse portion 4 is less than the lower limit above, an escape of heat to the front and back in the length direction may not be suppressed sufficiently. Conversely, when the length of the portion with approximately the smallest cross section of fuse portion 4 exceeds the upper limit above, the flexible printed circuit board may be unnecessarily large.

<Opening Portion>

A pair of opening portions 5 are formed on both sides of fuse portion 4 in a direction vertical to the direction of current flowing through fuse portion 4 in a two-dimensional view. A pair of opening portions 5 are formed symmetrically with respect to the center in the length direction of fuse portion 4. Opening portion 5 is preferably formed to have beveled corners in order to avoid the likeliness of breakage of the flexible printed circuit board due to stress concentration.

The opening portion 5 suppresses an escape of heat from fuse portion 4 to the right-left direction. That is, opening portion 5 reduces the heat capacity in the region in the vicinity of fuse portion 4, that is, the volume of base film 1 and insulting layer 3 present in the vicinity of fuse portion 4 and prevents diffusion of Joule heat produced in fuse portion 4 to accelerate the blowing of fuse portion 4 when overcurrent flows.

Since the blowing of fuse portion 4 is accelerated, the time during which the adjacent base film 1 and insulting layer 3 are heated is reduced when fuse portion 4 blows, whereby carbonization of base film 1 and insulting layer 3 can be suppressed. This can prevent the carbide generated at the time of blowing of fuse portion 4 from causing conduction (short circuit) between wiring portion 6 in front and back of the blown fuse portion 4 or between wiring portion 6 and another circuit portion in conductive pattern 2.

Opening portion 5 includes a protruding portion 7 close to the center region of the side edge of fuse portion 4 and a base portion 8 extending to cover the entire side edge of fuse portion 4 as viewed from the direction along the surface of base film 1. In other words, base portion 8 has a length in the longitudinal direction of fuse portion 4 longer than that fuse portion 4 and extends on both sides in the longitudinal direction from fuse portion 4 as viewed from the direction vertical to the longitudinal direction.

Protruding portion 7 reduces the heat capacity of base film 1 and insulting layer 3 in the vicinity of the center region of fuse portion 4 and, in particular, suppress heat dissipation from the center region of fuse portion 4, thereby inducing fuse portion 4 to blow at this center region.

In order to enhance the effect of suppressing heat dissipation from the center region of fuse portion 4 as described above, protruding portion 7 preferably has an end edge parallel to the side edge of fuse portion 4. The provision of the end edge of protruding portion 7 parallel to the side edge of fuse portion 4 can suppress diffusion of heat from the center region of fuse portion 4 to base film 1 and insulting layer 3 more effectively to further ensure blowing at the center region of fuse portion 4 and, in addition, further accelerate blowing of fuse portion 4.

Opening portion 5 is preferably formed such that the average distance in the width direction from the longitudinally central line of the circuit including fuse portion 4 to protruding portion 7 is smaller than the average distance in the width direction (a half of the average width of wiring portion 6) from the longitudinally central line to the side edge on the opening portion 5 side of wiring portion 6 in front and back of the fuse portion, in a two-dimensional view. That is, preferably, protruding portion 7 protrudes toward fuse portion 4 beyond the line connecting the side edges of wiring portion 6 in front and back of fuse portion 4. In this manner, protruding portion 7 protrudes closer to fuse portion 4 thereby inducing blowing at the center region of fuse portion 4 more reliably.

The lower limit of the length of the end edge of protruding portion 7 approximately parallel to the side edge of fuse portion 4 is preferably 0.1 mm, more preferably 0.3 mm. On the other hand, the upper limit of the length of the end edge of protruding portion 7 approximately parallel to the side edge of fuse portion 4 is not limited as long as protruding portion 7 does not interfere with wiring portion 6 in front and back of fuse portion 4. When the length of the end edge of protruding portion 7 approximately parallel to the side edge of fuse portion 4 is less than the lower limit above, the effect of inducing blowing of fuse portion 4 by protruding portion 7 may be insufficient.

Opening portion 5 is preferably formed such that there is a distance between protruding portion 7 and the side edge of fuse portion 4. When opening portion 5 is formed in a laminate of base film 1, conductive pattern 2, and insulating layer 3, even if opening portion 5 is displaced relative to conductive pattern 2, the distance between protruding portion 7 and the side edge of fuse portion 4 prevents further erroneous reduction of the width (cross section) of fuse portion 4 and undesired reduction of a current value at which fuse portion 4 blows. The provision of the distance between protruding portion 7 and the side edge of fuse portion 4 makes base film 1 and insulting layer 3 adhered to each other on both the right and left sides of fuse portion 4 and can prevent exposure of fuse portion 4. This can prevent occurrence of a short circuit, for example, due to intrusion of water.

The lower limit of the distance between protruding portion 7 and the side edge of fuse portion 4 is preferably 20 μm, more preferably 50 μm. On the other hand, the upper limit of the distance between protruding portion 7 and the side edge of fuse portion 4 is preferably 500 μm, more preferably 200 μm. When the distance between protruding portion 7 and the side edge of fuse portion 4 is less than the lower limit above, fuse portion 4 may be damaged by mistake when opening portion 5 is formed. Conversely, when the distance between protruding portion 7 and the side edge of fuse portion 4 exceeds the upper limit above, the effect of promoting blowing of fuse portion 4 may be insufficient.

As described above, opening portion 5 is formed into a two-step shape in which protruding portion 7 partially protrudes from base portion 8 formed along the entire length of fuse portion 4. With such a shape of opening portion 5, the strength of the flexible printed circuit board, in particular, base film 1 is not reduced too much while base portion 8 covering the side edge of fuse portion 4 reduces the volume of base film 1 and insulting layer 3 in the region adjacent to the entire fuse portion 4 and thus the heat capacity of the region in the vicinity of the fuse portion.

Method of Manufacturing Flexible Printed Circuit Board

The flexible printed circuit board can be manufactured by a method including the steps of: patterning a conductive layer laminated to one surface side of base film 1 to form conductive pattern 2 having fuse portion 4; laminating insulting layer 3 to one surface side of a laminate of base film 1 and conductive pattern 2; and forming opening portion 5 in a laminate of base film 1, conductive pattern 2, and insulting layer 3.

<Conductive Pattern Forming Step>

In the conductive pattern forming step, for example, a known method can be used to form a resist pattern and etch a conductor layer by photolithography. For the lamination of base film 1 with the conductor layer having conductive pattern 2, the methods such as using adhesive, thermocompression bonding, and laminating a conductor layer by deposition or plating on base film 1 can be used.

<Insulting Layer Laminating Step>

In the insulting layer laminating step, for example, a coverlay having an adhesive layer on the back surface of an insulating film is laminated as insulting layer 3 to one surface side of the laminate of base film 1 and conductive pattern 2. For example, a vacuum thermocompression bonding device is preferably used to reliably adhere base film 1 and insulating layer 3 on both sides of fuse portion 4.

<Opening Portion Forming Step>

In the opening portion forming step, opening portions 5 are formed on both sides of fuse portion 4, for example, by punching using a punch and a die or laser processing.

<Advantages>

As described above, the flexible printed circuit board includes a plurality of opening portions 5 to reduce the volume and thus the heat capacity of the vicinity region of base film 1 and insulting layer 3 to which heat may conduct from fuse portion 4 and reduce the delay in current interruption due to heat dissipation from fuse portion 4. This can reduce the amount of heat transmitted to base film 1 and insulting layer 3, thereby interrupting overcurrent relatively reliably.

In addition, opening portions 5 accelerate blowing of fuse portion 4 with overcurrent and thereby suppress carbonization of base film 1 and insulting layer 3, so that a short circuit (re-conduction) between both ends of the blown fuse portion 4 due to the carbide generated by blowing of fuse portion 4 and a short circuit between wiring portion 6 having fuse portion 4 and adjacent another wiring can be prevented, thereby interrupting overcurrent relatively reliably.

Moreover, since the flexible printed circuit board has opening portions 5 formed on both the right and left sides of fuse portion 4, the effect of allowing fuse portion 4 to blow fast is high, thereby interrupting overcurrent more reliably.

Other Embodiments

The embodiments disclosed here should be understood as being illustrative rather than being limitative in all respects. The scope of the present invention is shown not in the foregoing description but in the claims, and it is intended that all modifications that come within the meaning and range of equivalence to the claims are embraced here.

The flexible printed circuit board may be used as a fuse, that is, a single electric component in which a conductive pattern includes, as main elements, a fuse portion and terminal portions connected to both sides of the fuse portion for connecting to an external circuit.

The flexible printed circuit board may not include an insulting layer.

In the flexible printed circuit board, the fuse portion may be a portion having a thickness smaller than the other part of the conductive pattern and thereby having a reduced cross section.

The flexible printed circuit board may have an opening portion only on one of the right and left sides of the fuse portion of the conductive pattern.

In the flexible printed circuit board, the opening portion may be a notch open to the side edge of the flexible printed circuit board. The opening portion may not have a protruding portion.

In the flexible printed circuit board, although it is preferable that the opening portion may have a portion extending parallel to the side edge of the fuse portion at the end edge thereof, the end edge may have a shape that does not have a portion extending parallel to the side edge of the fuse portion, for example, an arc shape or an oval shape.

The flexible printed circuit board may have a plurality of fuse portions. When a plurality of fuse portions are disposed side by side, one opening portion provided between two fuse portions may be formed to promote current interruption of the fuse portion on both sides. As an example, one opening portion provided between two fuse portions may have protruding portions, each formed to protrude close to the center region of the fuse portion, on both sides of one base portion.

The flexible printed circuit board may be a double-sided board or a multilayer board. In this case, in order not to increase the heat capacity in a region in the vicinity of the fuse portion, the conductive pattern is formed such that another conductor is not disposed in a region overlapping the fuse portion and a region in the vicinity thereof in a two-dimensional view.

The flexible printed circuit board may have a component other than those described in the foregoing embodiment. As an example, the flexible printed circuit board may include a reinforcement plate or a shield film laminated to the base film or the insulting layer.

REFERENCE SIGNS LIST 1 base film
2 conductive pattern
3 insulting layer
4 fuse portion 5 opening portion
6 wiring portion
7 protruding portion
8 base portion

The invention claimed is:

1. A flexible printed circuit board comprising:
a base film having insulating properties;
a conductive pattern laminated to one surface side of the base film; and
an insulation layer disposed on the one surface side of the base film,
the conductive pattern forming part of a circuit and including at least one fuse portion having a cross section smaller than the other part of the circuit,
wherein the flexible printed circuit board comprises at least one opening portion passing through front and rear surfaces on at least one of right and left sides of the fuse portion in a two-dimensional view, a portion of the opening portion being closest to a side edge of the fuse portion is located only at a center region of the side edge in the two-dimensional view, and the center region is a region excluding a range of 30% of the entire length of the fuse portion from each of both ends in the length direction of the fuse portion.

2. The flexible printed circuit board according to claim 1, wherein there are the base film and the insulation layer laminated thereon between the fuse portion and the opening portion.

3. The flexible printed circuit board according to claim 1, wherein the portion of the opening portion is parallel to the side edge of the fuse portion.

4. The flexible printed circuit board according to claim 1, wherein the fuse is formed so as to have a line width smaller than the conductive pattern in front and back, and the portion of the opening portion protrudes toward the fuse portion beyond a line connecting side edges of the conductive pattern in front and back of the fuse portion.

5. A flexible printed circuit board comprising:
a base film having insulating properties;
a conductive pattern laminated to one surface side of the base film; and
an insulation layer disposed on the one surface side of the base film,
the conductive pattern forming part of a circuit and including at least one fuse portion having a cross section smaller than the other part of the circuit,
wherein the flexible printed circuit board comprises at least one opening portion passing through front and rear surfaces on at least one of right and left sides of the fuse portion in a two-dimensional view, a portion of the opening portion being closest to a side edge of the fuse portion is located only at a center region of the side edge in the two-dimensional view, and the opening portion is located only at the center region of the side edge.

6. The flexible printed circuit board according to claim 5, wherein there are the base film and the insulation layer laminated thereon between the fuse portion and the opening portion.

7. The flexible printed circuit board according to claim 5, wherein the portion of the opening portion is parallel to the side edge of the fuse portion.

8. The flexible printed circuit board according to claim 5, wherein the fuse is formed so as to have a line width smaller than the conductive pattern in front and back, and the portion of the opening portion protrudes toward the fuse portion beyond a line connecting side edges of the conductive pattern in front and back of the fuse portion.

* * * * *